(12) United States Patent
Philippou et al.

(10) Patent No.: US 10,439,055 B2
(45) Date of Patent: Oct. 8, 2019

(54) IGBT WITH DV/DT CONTROLLABILITY

(71) Applicant: Infineon Technologies AG, Neubiberg (DE)

(72) Inventors: Alexander Philippou, Munich (DE); Christian Jaeger, Munich (DE); Johannes Georg Laven, Taufkirchen (DE); Antonio Vellei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/940,708

(22) Filed: Mar. 29, 2018

(65) Prior Publication Data

US 2018/0286971 A1    Oct. 4, 2018

(30) Foreign Application Priority Data

Apr. 4, 2017    (DE) .................... 10 2017 107 174

(51) Int. Cl.
| | |
|---|---|
| *H01L 29/739* | (2006.01) |
| *H01L 29/66* | (2006.01) |
| *H01L 29/06* | (2006.01) |
| *H01L 29/10* | (2006.01) |
| *H01L 29/40* | (2006.01) |

(52) U.S. Cl.
CPC ...... *H01L 29/7397* (2013.01); *H01L 29/0619* (2013.01); *H01L 29/0634* (2013.01); *H01L 29/0696* (2013.01); *H01L 29/1095* (2013.01); *H01L 29/407* (2013.01); *H01L 29/66325* (2013.01); *H01L 29/7393* (2013.01); *H01L 29/7395* (2013.01); *H01L 29/7396* (2013.01); *H01L 2924/13055* (2013.01)

(58) Field of Classification Search
CPC ............. H01L 29/7397; H01L 29/1095; H01L 29/0696; H01L 29/7395; H01L 2924/13055; H01L 29/7393; H01L 29/66325
See application file for complete search history.

(56) References Cited

U.S. PATENT DOCUMENTS

| | | | |
|---|---|---|---|
| 9,520,487 B2 * | 12/2016 | Hirabayashi | ........ H01L 29/7397 |
| 2007/0114598 A1 * | 5/2007 | Hotta | .................. H01L 29/0619 257/330 |
| 2011/0101417 A1 | 5/2011 | Ogura et al. | |
| 2011/0201187 A1 * | 8/2011 | Nishiwaki | ........... H01L 29/0834 438/529 |
| 2012/0292662 A1 * | 11/2012 | Matsuura | .......... H01L 29/66348 257/139 |

(Continued)

FOREIGN PATENT DOCUMENTS

| | | |
|---|---|---|
| DE | 102010036501 A1 | 2/2011 |
| DE | 102012201950 A1 | 10/2012 |

(Continued)

*Primary Examiner* — Ngan V Ngo
(74) *Attorney, Agent, or Firm* — Murphy, Bilak & Homiller, PLLC

(57) ABSTRACT

An IGBT having a barrier region is presented. A power unit cell of the IGBT has at least two trenches that may both extend into the barrier region. The barrier region may be p-doped and vertically confined, i.e., in and against the extension direction, by means of the drift region. The barrier region can be electrically floating.

24 Claims, 9 Drawing Sheets

(56) References Cited

U.S. PATENT DOCUMENTS

| | | | |
|---|---|---|---|
| 2012/0313139 A1* | 12/2012 | Matsuura | H01L 29/36 257/139 |
| 2013/0328105 A1* | 12/2013 | Matsuura | H01L 29/0696 257/139 |
| 2014/0231866 A1* | 8/2014 | Senoo | H01L 29/36 257/139 |
| 2015/0008479 A1* | 1/2015 | Kato | H01L 29/6634 257/139 |
| 2015/0340480 A1* | 11/2015 | Matsuura | H01L 29/7813 257/144 |
| 2015/0349103 A1 | 12/2015 | Onozawa et al. | |
| 2016/0155831 A1 | 6/2016 | Madathil | |
| 2016/0172453 A1* | 6/2016 | Hirabayashi | H01L 29/0623 257/144 |
| 2016/0359026 A1* | 12/2016 | Matsuura | H01L 29/7397 |
| 2016/0365413 A1* | 12/2016 | Wagner | H01L 29/1095 |
| 2017/0018637 A1 | 1/2017 | Kitamura | |
| 2017/0263738 A1 | 9/2017 | Soeno et al. | |
| 2019/0067491 A1* | 2/2019 | Blanchard | H01L 21/26513 |

FOREIGN PATENT DOCUMENTS

| | | |
|---|---|---|
| DE | 102014109475 A1 | 1/2015 |
| DE | 102014117364 A1 | 5/2015 |
| DE | 102014226161 B4 | 10/2017 |
| EP | 2674979 A2 | 12/2013 |

* cited by examiner

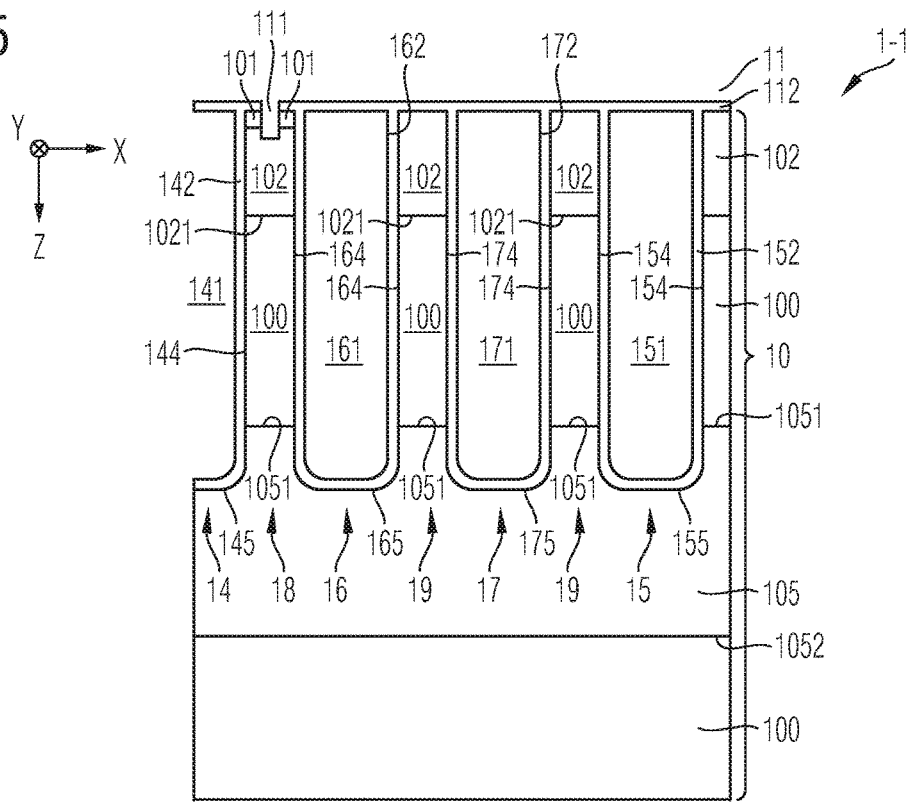
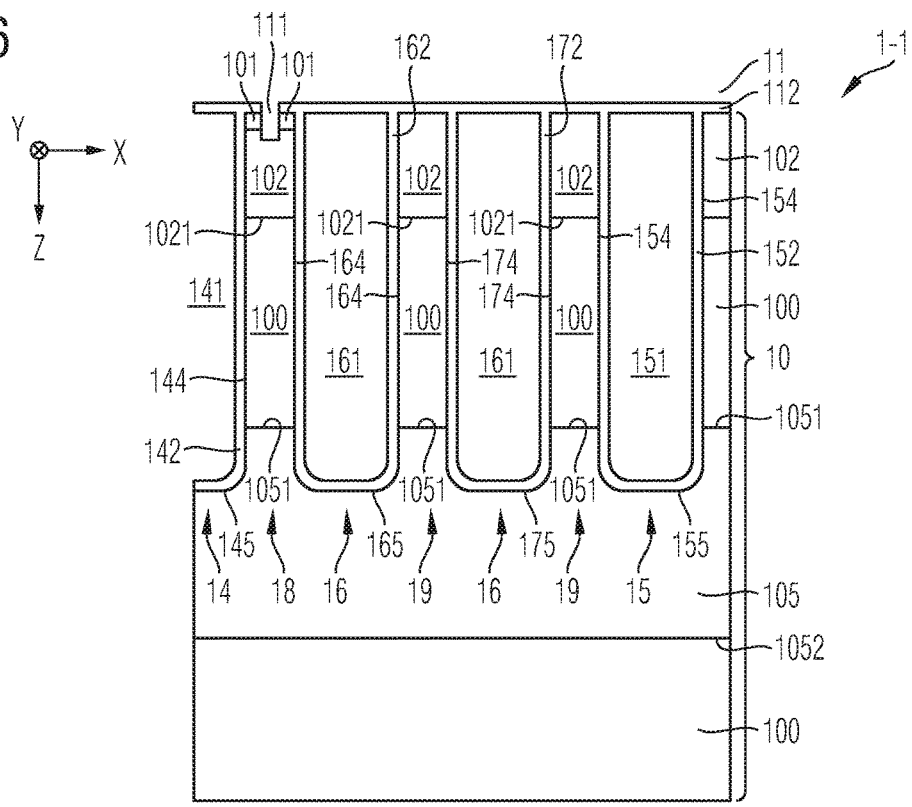

IGBT WITH DV/DT CONTROLLABILITY

TECHNICAL FIELD

This specification refers to embodiments of an IGBT and to embodiments of a method of processing an IGBT. For example, this specification is directed to embodiments of an IGBT having one or more power unit cells and a barrier region, e.g., for dV/dt controllability, and to corresponding processing methods.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

An IGBT usually comprises a semiconductor body configured to conduct a load current along a load current path between two load terminals of the IGBT. Further, the load current path may be controlled by means of an insulated electrode, sometimes referred to as gate electrode. For example, upon receiving a corresponding control signal from, e.g., a driver unit, the control electrode may set the IGBT in one of a conducting state and a blocking state.

In some cases, the gate electrode may be included within a trench of the IGBT, wherein the trench may exhibit, e.g., a stripe configuration or a needle configuration.

Further, such trench occasionally includes more than only one electrode, e.g., two or more electrodes that are arranged separately from each other and sometimes also electrically insulated from each other. For example, a trench may comprise both a gate electrode and a field electrode, wherein the gate electrode can be electrically insulated from each of the load terminals, and wherein the field electrode can be electrically connected to one of the load terminals.

It is usually desirable to keep losses, e.g., switching losses, of the IGBT low. For example, low switching losses may be achieved by ensuring short switching durations, e.g., a short turn-on duration and/or a short turn-off duration. On the other hand, in a given application, there may also be requirements regarding a maximum slope of the voltage (dV/dt) and/or a maximum slope of the load current (dI/dt).

SUMMARY

According to an embodiment, an IGBT comprises: a semiconductor body coupled to a first load terminal and a second load terminal of IGBT and comprising a drift region configured to conduct a load current between said terminals, the drift region comprising dopants of a first conductivity type; and at least one power unit cell that includes at least one control trench having a control trench electrode and at least one further trench having a further trench electrode coupled to the control trench electrode. Further the at least one power unit cell has at least one active mesa comprising a source region with dopants of the first conductivity type and electrically connected to the first load terminal and a channel region with dopants of a second conductivity type and separating the source region and the drift region, wherein, in the active mesa at least a respective section of each of the source region, the channel region and the drift region are arranged adjacent to a sidewall of the control trench, and wherein the control trench electrode is configured to receive a control signal from a control terminal of the IGBT and to control the load current in the active mesa, the further trench electrode not being configured to control the load current; and an electrically floating semiconductor barrier region implemented in the semiconductor body and comprising dopants of the second conductivity type, the barrier region laterally overlapping with both the active mesa and a bottom of the further trench.

According to another embodiment, a method of processing an IGBT comprises: providing a semiconductor body configured to be coupled to a first load terminal and a second load terminal of the IGBT and comprising a drift region configured to conduct a load current between said terminals, the drift region comprising dopants of a first conductivity type; and forming at least one power unit cell that includes at least one control trench having a control trench electrode and at least one further trench having a further trench electrode coupled to the control trench electrode; at least one active mesa comprising a source region with dopants of the first conductivity type and electrically connected to the first load terminal and a channel region with dopants of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the IGBT and to control the load current in the active mesa, the further trench electrode not being configured to control the load current; and, in the semiconductor body, forming an electrically floating semiconductor barrier region comprising dopants of the second conductivity type, the barrier region laterally overlapping with both the active mesa and a bottom of the further trench.

According to an embodiment, an IGBT comprises: a semiconductor body coupled to a first load terminal and a second load terminal of IGBT and comprising a drift region configured to conduct a load current between said terminals, the drift region comprising dopants of a first conductivity type; and at least one power unit cell that includes at least one control trench having a control trench electrode and at least one further trench having a further trench electrode. Further the at least one power unit cell has at least one active mesa comprising a source region with dopants of the first conductivity type and electrically connected to the first load terminal and a channel region with dopants of a second conductivity type and separating the source region and the drift region, wherein, in the active mesa at least a respective section of each of the source region, the channel region and the drift region are arranged adjacent to a sidewall of the control trench, and wherein the control trench electrode is configured to receive a control signal from a control terminal of the IGBT and to control the load current in the active mesa; and an electrically floating semiconductor barrier region implemented in the semiconductor body and comprising dopants of the second conductivity type, the barrier region laterally overlapping with both an entire width of the active mesa and a bottom of the further trench.

According to another embodiment, a method of processing an IGBT comprises: providing a semiconductor body configured to be coupled to a first load terminal and a second load terminal of the IGBT and comprising a drift region configured to conduct a load current between said terminals, the drift region comprising dopants of a first conductivity type; and forming at least one power unit cell that includes at least one control trench having a control trench electrode and at least one further trench having a further trench electrode; at least one active mesa comprising a source region with dopants of the first conductivity type and electrically connected to the first load terminal and a channel region with dopants of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the IGBT and to control the load current in the active mesa; and, in the semiconductor body, forming an electrically floating semiconductor barrier region comprising dopants of the second conductivity type, the barrier region laterally overlapping with both an entire width of the active mesa and a bottom of the further trench.

According to an embodiment, an IGBT comprises: a semiconductor body coupled to a first load terminal and a second load terminal of IGBT and comprising a drift region configured to conduct a load current between said terminals, the drift region comprising dopants of a first conductivity type; and at least one power unit cell that includes at least one control trench having a control trench electrode and at least one further trench having a further trench electrode. Further the at least one power unit cell has at least one active mesa comprising a source region with dopants of the first conductivity type and electrically connected to the first load terminal and a channel region with dopants of a second conductivity type and separating the source region and the drift region, wherein, in the active mesa at least a respective section of each of the source region, the channel region and the drift region are arranged adjacent to a sidewall of the control trench, and wherein the control trench electrode is configured to receive a control signal from a control terminal of the IGBT and to control the load current in the active mesa; and at least one inactive mesa arranged adjacent to the at least one further trench, wherein a transition between the first load terminal and the inactive mesa provides an electrical insulation at least for charge carriers of the first conductivity type; and a semiconductor barrier region implemented in the semiconductor body and comprising dopants of the second conductivity type. A respective lower portion of both the control trench and the further trench extends into the barrier region, each lower portion being formed by the deepest fifth part of the respective trench. A total active intersection area is defined by a transition between the lower portion of the control trench and the barrier region, and a total further intersection area is defined by a transition between the lower portion of the further trench and the barrier region. The active intersection area amounts to at least one tenth of the further intersection area and to no more than the further intersection area.

According to an embodiment, a method of processing an IGBT comprises: providing a semiconductor body coupled to a first load terminal and a second load terminal of IGBT and comprising a drift region configured to conduct a load current between said terminals, the drift region comprising dopants of a first conductivity type; and forming at least one power unit cell that includes at least one control trench having a control trench electrode and at least one further trench having a further trench electrode. Further the at least one power unit cell has at least one active mesa comprising a source region with dopants of the first conductivity type and electrically connected to the first load terminal and a channel region with dopants of a second conductivity type and separating the source region and the drift region, wherein, in the active mesa at least a respective section of each of the source region, the channel region and the drift region are arranged adjacent to a sidewall of the control trench, and wherein the control trench electrode is configured to receive a control signal from a control terminal of the IGBT and to control the load current in the active mesa; and at least one inactive mesa arranged adjacent to the at least one further trench, wherein a transition between the first load terminal and the inactive mesa provides an electrical insulation at least for charge carriers of the first conductivity type; and forming, in the semiconductor body, a semiconductor barrier region that comprises dopants of the second conductivity type, such that: A respective lower portion of both the control trench and the further trench extends into the barrier region, each lower portion being formed by the deepest fifth part of the respective trench; a total active intersection area is defined by a transition between the lower portion of the control trench and the barrier region, and a total further intersection area is defined by a transition between the lower portion of the further trench and the barrier region; and such that active intersection area amounts to at least one tenth of the further intersection area and to no more than the further intersection area.

For example, a respective upper portion of both the control trench and the further trench extends partially into the barrier region, each upper portion being formed by the remaining four fifth parts of the respective trench, the upper portion of the control trench being arranged adjacent to the source region and the channel region.

According to an embodiment, an IGBT comprises: a semiconductor body coupled to a first load terminal and a second load terminal of IGBT and comprising a drift region configured to conduct a load current between said terminals, the drift region comprising dopants of a first conductivity type; and at least one power unit cell that includes at least one control trench having a control trench electrode and at least one further trench having a further trench electrode. Further the at least one power unit cell has at least one active mesa comprising a source region with dopants of the first conductivity type and electrically connected to the first load terminal and a channel region with dopants of a second conductivity type and separating the source region and the drift region, wherein, in the active mesa at least a respective section of each of the source region, the channel region and the drift region are arranged adjacent to a sidewall of the control trench, and wherein the control trench electrode is configured to receive a control signal from a control terminal of the IGBT and to control the load current in the active mesa; and at least one inactive mesa arranged adjacent to the at least one further trench, wherein a transition between the first load terminal and the inactive mesa provides an electrical insulation at least for charge carriers of the first conductivity type; and a semiconductor barrier region implemented in the semiconductor body and comprising dopants of the second conductivity type. A respective lower portion of both the control trench and the further trench extends into the barrier region, each lower portion being formed by the deepest fifth part of the respective trench. A respective upper portion of both the control trench and the further trench is formed by the remaining four fifth parts of the respective trench, the upper portion of the control trench being arranged adjacent to the source region and the channel region. A total active intersection area is defined by a transition between the lower portion of the control trench and the barrier region, and a total further intersection area is defined by a transition between the lower portion of the further trench and the barrier region. A total channel intersection area is defined by a transition between the upper portion of the control trench and a subregion formed by both the source region and the channel region in the active mesa. The total channel intersection area is smaller than the sum of the active intersection area and the further intersection area.

According to an embodiment, a method of processing an IGBT comprises: providing a semiconductor body coupled to a first load terminal and a second load terminal of IGBT and comprising a drift region configured to conduct a load current between said terminals, the drift region comprising dopants of a first conductivity type; and forming at least one power unit cell that includes at least one control trench having a control trench electrode and at least one further trench having a further trench electrode. Further the at least one power unit cell has at least one active mesa comprising a source region with dopants of the first conductivity type and electrically connected to the first load terminal and a channel region with dopants of a second conductivity type and separating the source region and the drift region, wherein, in the active mesa at least a respective section of each of the source region, the channel region and the drift region are arranged adjacent to a sidewall of the control trench, and wherein the control trench electrode is configured to receive a control signal from a control terminal of the IGBT and to control the load current in the active mesa; and at least one inactive mesa arranged adjacent to the at least one further trench, wherein a transition between the first load terminal and the inactive mesa provides an electrical insulation at least for charge carriers of the first conductivity type; and forming, in the semiconductor body, a semiconductor barrier region that comprises dopants of the second conductivity type, such that: A respective lower portion of both the control trench and the further trench extends into the barrier region, each lower portion being formed by the deepest fifth part of the respective trench; such that a respective upper portion of both the control trench and the further trench is formed by the remaining four fifth parts of the respective trench, the upper portion of the control trench being arranged adjacent to the source region and the channel region; such that a total active intersection area is defined by a transition between the lower portion of the control trench and the barrier region; such that a total further intersection area is defined by a transition between the lower portion of the further trench and the barrier region; such that a total channel intersection area is defined by a transition between the upper portion of the control trench and a subregion formed by both the source region and the channel region in the active mesa; and such that the total channel intersection area is smaller than the sum of the active intersection area and the further intersection area.

The further trench mentioned above can be a dummy trench, and the further trench electrode can be a dummy trench electrode. The dummy trench electrode may be electrically coupled to the control trench electrode. For example, both the dummy trench electrode and the control trench electrode are electrically coupled to a control terminal of the IGBT, wherein, e.g., the control terminal may be electrically connected to an output of a driver unit for driving the IGBT. For example, both the dummy trench electrode and the control trench electrode are electrically connected to the control terminal of the IGBT, i.e., by means of a respective low ohmic connection. E.g., the electrical potential of the dummy trench electrode can be at least substantially identical to the electrical potential of the control trench electrode. In another embodiment, a first ohmic resistance between the control terminal and the control trench electrode may be different from a second ohmic resistance between the control terminal and the dummy trench electrode. The difference between the first ohmic resistance and the second ohmic resistance may be within the range of 0Ω to 100Ω, for example. For example, the second ohmic resistance is greater than the first ohmic resistance.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 5 schematically and exemplarily illustrates a section of a vertical cross-section of an IGBT in accordance with one or more embodiments;

FIG. 6 schematically and exemplarily illustrates a section of a vertical cross-section of an IGBT in accordance with one or more embodiments;

DETAILED DESCRIPTION

Figure 1:
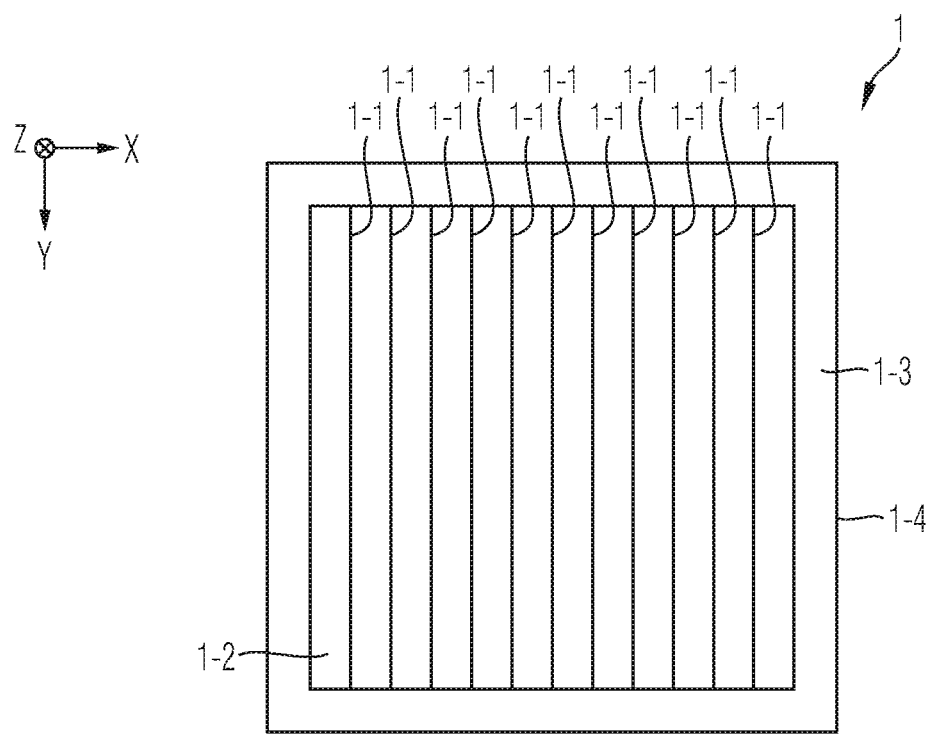
FIG. 1 schematically and exemplarily illustrates a section of a horizontal projection of an IGBT in accordance with one or more embodiments.

In the following detailed description, reference is made to the accompanying drawings which form a part hereof and in which are shown by way of illustration specific embodiments in which the invention may be practiced.

In this regard, directional terminology, such as "op", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention.

The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, an IGBT, e.g., exhibiting a stripe cell or cellular cell configuration, e.g., an IGBT that may be used within a power converter or a power supply. Thus, in an embodiment, such IGBT can be configured to carry a load current that is to be fed to a load and/or, respectively, that is provided by a power source. For example, the IGBT may comprise one or more active power semiconductor cells, such as a monolithically integrated IGBT cell, and/or a monolithically integrated RC-IGBT cell. Such transistor cells may be integrated in a power semiconductor module. A plurality of such cells may constitute a cell field that is arranged with an active region of the IGBT.

The term "IGBT" as used in this specification intends to describe a semiconductor device on a single chip with high voltage blocking and/or high current-carrying capabilities. In other words, such IGBT is intended for high current, typically in the Ampere range, e.g., up to several ten or hundred Ampere, and/or high voltages, typically above 15 V, more typically 100 V and above, e.g., up to at least 400 V.

For example, the IGBT described below may be a semiconductor transistor exhibiting a stripe cell configuration or a cellular cell configuration and can be configured to be employed as a power component in a low-, medium- and/or high voltage application.

For example, the term "IGBT" as used in this specification is not directed to a MOSFET configuration and not to logic semiconductor devices that are used for, e.g., storing data, computing data and/or other types of semiconductor-based data processing.

Figure 2:
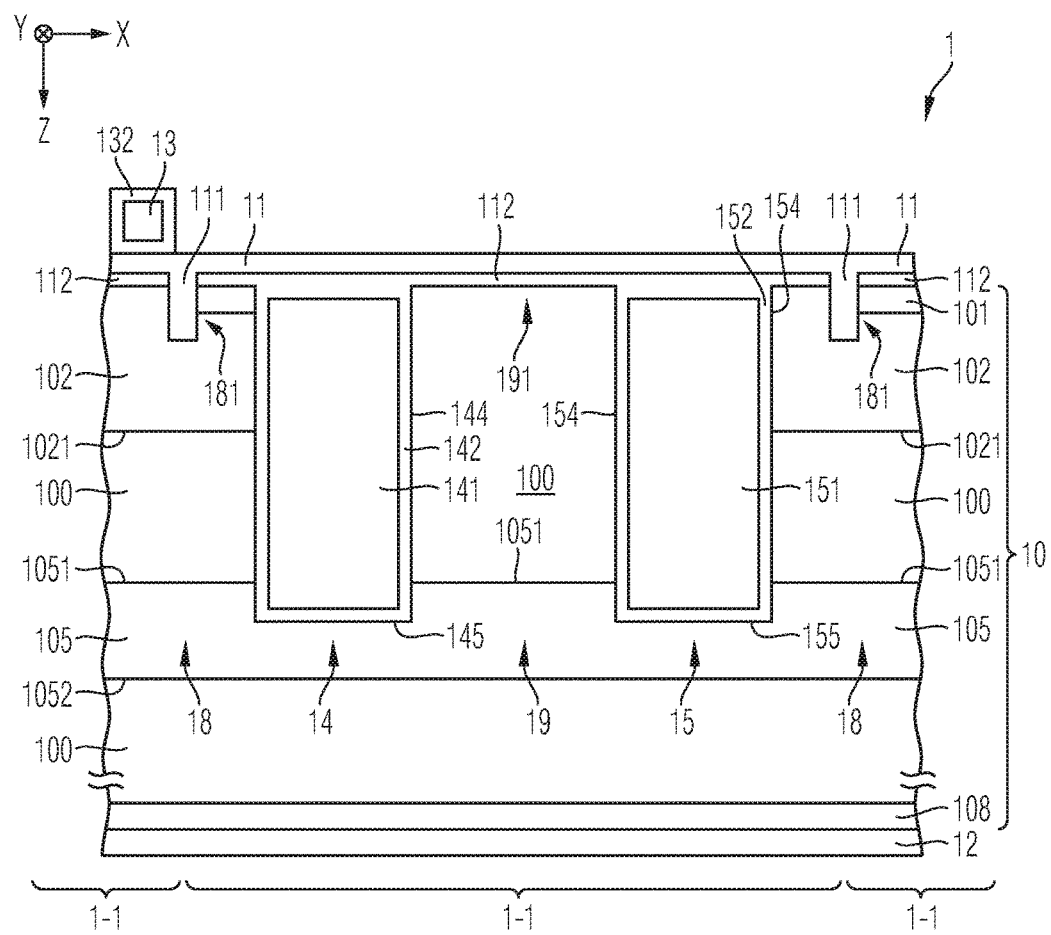
FIG. 2 schematically and exemplarily illustrates a section of a vertical cross-section of an IGBT in accordance with one or more embodiments.

FIG. 1 schematically and exemplarily illustrates a section of a horizontal projection of an IGBT 1 in accordance with one or more embodiments. FIG. 2 schematically and exemplarily illustrates a section of a vertical cross-section of an embodiment of the IGBT 1 in accordance with one or more embodiments. In the following, it will be referred to each of FIG. 1 and FIG. 2.

For example, the IGBT 1 comprises a semiconductor body 10 that is coupled to a first load terminal 11 and a second load terminal 12. For example, the first load terminal 11 is an emitter terminal, whereas the second load terminal 12 can be a collector terminal.

The semiconductor body 10 may comprise a drift region 100 with dopants of the first conductivity type. For example, the extension of the drift region 100 along the extension direction Z and its dopant concentration are chosen in dependence of the blocking voltage rating for which the IGBT 1 shall be designed, as it is known to the skilled person.

Further, the first load terminal 11 may be arranged on the frontside of the IGBT 1 and may include a frontside metallization. The second load terminal 12 may be arranged, opposite to the frontside, e.g., on a backside of the IGBT 1 and may include, for example, a backside metallization. Accordingly, the IGBT 1 may exhibit a vertical configuration. In another embodiment, both the first load terminal 11 and the second load terminal 12 may be arranged on a common side, e.g., both on the frontside, of the IGBT 1.

The IGBT 1 may further include an active region 1-2, an inactive termination structure 1-3 and a chip edge 1-4. The chip edge 1-4 may laterally terminate the semiconductor body 10, e.g., the chip edge 1-4 may have become into being by means of wafer dicing, for example, and may extend along the extension direction Z. The inactive termination structure 1-3 may be arranged between the active region 1-2 and the chip edge 1-4, as illustrated in FIG. 1.

In the present specification, the terms "active region" and "termination structure" are employed in a regular manner, i.e., the active region 1-2 and the termination structure 1-3 may be configured to provide for the principle technical functionalities typically associated therewith. For example, the active region 1-2 of the IGBT 1 is configured to conduct the load current between the terminals 11, 12, whereas the termination structure 1-3 does not conduct the load current, but rather fulfills functions regarding the course of the electric field, ensuring the blocking capability, safely terminating the active region 1-2 and so forth, in accordance with an embodiment. For example, the termination structure 1-3 may entirely surround the active region 1-2, as illustrated in FIG. 1.

The active region 1-2 may comprise at least one power unit cell 1-1. In an embodiment, there are included a plurality of such power unit cells 1-1 within the active region 1-2. The number of power unit cells 1-1 may be greater than 100, than 1000, or even greater than 10,000.

Each power unit cell 1-1 may exhibit a stripe configuration as schematically illustrated in FIG. 1, wherein the total lateral extension in one lateral direction, e.g., along the second lateral direction Y, of each power unit cell 1-1 and at least one or more of its components may substantially correspond to the total extension of the active region 1-2 along this lateral direction. However, this does not exclude that one or more components of the respective power unit cell 1-1 is structured along the second lateral direction Y; e.g., in an embodiment, the source region mentioned below (reference numeral 101) may be structured along the second lateral direction Y within the respective power unit cell 1-1. For example, the source region is only locally provided, with intermission regions (e.g., of the second conductivity type) separating adjacent local source regions along the second lateral direction Y (cf. FIG. 11).

In another embodiment, each power unit cell 1-1 may exhibit a cellular configuration, wherein the lateral extensions of each power unit cell 1-1 may be substantially smaller than the total lateral extensions of the active region 1-2.

In an embodiment, each of the plurality of power unit cells 1-1 that are included in the active region 1-2 exhibit the same set-up. An example of such set-up will now be described with respect to FIG. 2. However, this does not exclude that the active region 1-2 further comprises other cells of a different type, e.g., auxiliary cells or the like (not illustrated).

Each power unit cell 1-1 may extend at least partially into the semiconductor body 10 and may comprise at least a section of the drift region 100. Further, each power unit cell 1-1 may be electrically connected with the first load terminal 11. Each power unit cell 1-1 may be configured to conduct a part of the load current between said terminals 11 and 12, and to block a blocking voltage applied between said terminals 11 and 12.

For controlling the IGBT 1, each power unit cell 1-1 may be operatively coupled to or, respectively, comprise a control electrode 141 configured to selectively set the respective power unit cell 1-1 into one of the conducting state and the blocking state.

For example, referring to the example illustrated in FIG. 2, a source region 101 may be electrically connected with the first load terminal 11 and may comprise dopants of the first conductivity type, e.g., at a significantly greater dopant concentration as the drift region 100. Further, a channel region 102 may be provided that comprises dopants of the second conductivity type and that separates the source region 101 and the drift region 100 from each other, e.g., the channel region 102 isolates the source region 101 from the drift region 100.

For example, the at least one power unit cell 1-1 includes at least one control trench 14 having the control trench electrode 141.

Further, in an embodiment, the at least one power unit cell 1-1 may include at least one further trench 15 having a further trench electrode 151. The further trench electrode 151 can be coupled to the control trench electrode 141.

The further trench 15 mentioned above can be a dummy trench, and the further trench electrode 151 can be a dummy trench electrode. The dummy trench electrode 151 may be electrically coupled to the control trench electrode 141. For example, both the dummy trench electrode 151 and the control trench electrode 141 are electrically coupled to a control terminal 13 of the IGBT 1, wherein, e.g., the control terminal 13 may be electrically connected to an output of a driver unit (not illustrated) for driving the IGBT 1. For example, both the dummy trench electrode 151 and the control trench electrode 141 are electrically connected to the control terminal 13 of the IGBT 1, i.e., by means of a respective low ohmic connection (not illustrated). E.g., the electrical potential of the dummy trench electrode 151 can be at least substantially identical to the electrical potential of the control trench electrode 141. In another embodiment, a first ohmic resistance between the control terminal 13 and the control trench electrode 141 may be different from a second ohmic resistance between the control terminal 13 and the dummy trench electrode 151. The difference between the first ohmic resistance and the second ohmic resistance may be within the range of 0Ω to 100Ω, for example. For example, the second ohmic resistance is greater than the first ohmic resistance.

In another embodiment, the further trench 15 may be a trench of type different from the dummy trench, e.g., a source trench (as described further below), a floating trench (as described further below) or a further control trench.

For illustrative purposes, the further trench 15 is in the following almost always referred to as dummy trench 15, e.g., to a dummy trench 15 having the limitations as described above. However, it shall be understood that in accordance with other embodiments, the dummy trench 15 as described below may be replaced with another trench type, e.g., with one of a source trench (as described further below), a floating trench (as described further below) or a further control trench, even though the present specification is primarily related to the case where the further trench 15 is implemented as a dummy trench as described above.

For example, both the control trench 14 and the dummy trench 15 may extend into the semiconductor body 10 along the extension direction Z and may both include an insulator 142, 152 that insulates the respective trench electrode 141, 151 from the semiconductor body 10.

The trench electrodes 141, 151 of the at least one control trench 14 and of the at least one dummy trench 15 may both be electrically coupled (e.g., electrically connected) to the control terminal 13 of the IGBT 1, in accordance with an embodiment.

For example, the control terminal 13 is a gate terminal. Further, the control terminal 13 may be electrically connected to the control trench electrode 141 and electrically insulated from the first load terminal 11, the second load terminal 12 and the semiconductor body 10, e.g., by means of at least an insulation structure 132.

In an embodiment, the IGBT 1 may be controlled by applying a voltage between the first load terminal 11 and the control terminal 13, e.g., so as to selectively set the IGBT 1 into one of the conducting state and the blocking state.

For example, the IGBT 1 is configured to be controlled based on a gate-emitter-voltage $V_{GE}$, e.g., in a principle manner of controlling an IGBT known to the skilled person.

In an embodiment, the dummy trench electrode 151 may also be electrically connected to the control terminal 13 and thus receive the same control signal as the control trench electrode 141.

In another embodiment, the dummy trench electrode 151 may be electrically coupled to the control terminal 13 by means of a resistor having a resistance within the range of 1e-3 Ohm to 1 Ohm, within the range of 1 Ohm to 10 Ohm, or within the range of 10 Ohm to 100 Ohm.

In another embodiment, the dummy trench electrode 151 is electrically connected to a second control terminal (not illustrated) and thus receives a control signal different from the control signal provided to the control trench electrode 141.

Further, the at least one power unit cell 1-1 of the IGBT 1 may have at least one active mesa 18 electrically connected to the first load terminal 11, the active mesa 18 comprising the source region 101, the channel region 102 and a part of the drift region 100, wherein, in the active mesa 18, respective sections of these regions 101, 102, 100 can be arranged adjacent to a sidewall 144 of the control trench 14, as exemplarily illustrated in FIG. 2. For example, both the source region 101 and the channel region 102 are electrically connected to the first load terminal 11, e.g., by means of a contact plug 111.

Further, the control trench electrode 141 (herein also referred to as control electrode 141) can be configured to receive a control signal from the control terminal 13 and to control the load current in the active mesa 18, e.g., by inducing an inversion channel in the channel region 102 so as to set the IGBT 1 into a conducting state. Thus, a transition 181 between the first load terminal 11 and the active mesa 18 may provide for an interface for the load current to pass from the first load terminal 11 into the semiconductor body 10 and/or vice versa.

For example, the control electrodes 141 of all power unit cells 1-1 that are included in the active region 1-2 may be electrically connected to the control terminal 13.

In addition to the active mesa 18 included in the at least one power unit cell 1-1, the at least one power unit cell 1-1 of the IGBT 1 can have at least one inactive mesa 19, e.g. arranged adjacent to the at least one dummy trench 15, wherein a transition 191 between the first load terminal 11 and the inactive mesa 19 provides an electrical insulation at least for charge carriers of the first conductivity type.

In an embodiment, the power unit cell 1-1 may be configured to prevent the load current from crossing said transition 191 between the inactive mesa 19 and the first load terminal 11. For example, the inactive mesa 19 does not allow for inducing an inversion channel. In contrast to the active mesa 18, the inactive mesa 19 does not conduct the load current during the conducting state of the IGBT 1, in accordance with an embodiment. For example, the inactive mesa 19 can be considered as a decommissioned mesa that is not used for the purpose of carrying the load current.

With respect to FIG. 2 and FIG. 5, two variants of the active mesa 18 shall be elucidated. For example, referring to FIG. 5, in a first variant, the source region 101 can be arranged on both sides of the contact plug 111, e.g., both sections of the source region 101 contact, with their inner sides, the contact plug 111, and, with their outer sides, the trench sidewalls (e.g., 144 and 154 (or 164)) that spatially confine the active mesa 18. In this first variant, the active mesa 18 can be regarded as being active along its entire extension in the first lateral direction X, i.e., along its entire width. Now referring to FIG. 2 again, in a second variant, the active mesa 18 is not active along its entire width, but divided into an active portion and an inactive portion, wherein each of said portions may have the same share of the total mesa volume. E.g., the source region 101 is only present between the contact plug 111 and the sidewall 144 of the control trench 14. In the portion where the source region 101 is present, the active mesa 18 can be active, e.g., conduct a part of the load current. On the other side of the contact plug 111, e.g., that faces to another type trench than the control trench, e.g., a dummy trench or a source trench (mentioned further below), the active mesa 18 may have its inactive portion; there, due to lack of the source region 101, an inversion channel cannot be induced and hence no part of the load current can be conducted.

Herein, the description of the inactive mesa 19 can analogously apply to the inactive portion of the active mesa 18.

In a first embodiment of the inactive mesa 19, the inactive mesa 19 is not electrically connected to the first load terminal 11, but electrically insulated therefrom, e.g., by means of an insulation layer 112. In this embodiment, the transition 191 between the first load terminal 11 and the inactive mesa 19 provides an electrical insulation not only for charge carriers of the first conductivity type, but also for charge carriers of the second conductivity type. To this end, in a variant the inactive mesa 19 comprises neither section of the source region 101 nor a section of the channel region 102 nor is the inactive mesa 19 contacted by means of a contact plug (cf. reference numeral 111), as illustrated in FIG. 2. In another variant, the inactive mesa 19 may be configured in a similar manner as the active mesa 18, e.g., by also comprising a section of the source region 101 and/or a section of the channel region 102, the difference to the active mesa 18 including that neither the section of the source region 101 (if present) nor the section of the channel region 102 of the inactive mesa 19 is electrically connected to the first load terminal 11. In accordance with the first embodiment of the inactive mesa 19, no current at all crosses said transition 191.

In a second embodiment of the inactive mesa 19, the inactive mesa 19 may be electrically connected to the first load terminal 11, wherein the transition 191 between the first load terminal 11 and the inactive mesa 19 provides an electrical insulation only for charge carriers of the first conductivity type, but not for charge carrier of the second conductivity type. In other words, in this second embodiment, the inactive mesa 19 may be configured at allow a current of charge carriers of the second conductivity type, e.g., a hole current, to pass said transition 191. For example, depending on the electrical potential of the trench electrode of the trench adjacent to the inactive mesa 19, e.g., the dummy trench electrode 151, such hole current may only temporarily come into being, e.g., shortly before carrying out a turn-off operation, e.g., so as to reduce the total charge carrier concentration present in the semiconductor body 10. As stated above, in this second embodiment, the inactive mesa 19 may be electrically connected to the first load terminal 11. For example, a doped contact region (not illustrated) with dopants of the second conductivity type (that is different from the barrier region 105 mentioned below) of the inactive mesa 19 may be electrically connected to the first load terminal 11, e.g., by means of a contact plug similar or identical to the type of contact plug 111 that may be used to contact the active mesa 18. The doped contact region (not illustrated) with dopants of the second conductivity type and may isolate the section of the drift region 100 that is present within the inactive mesa 19 from the first load terminal 11. For example, in accordance with the second embodiment of the inactive mesa 19, within the inactive mesa 19, there is no region doped with dopants of the first conductivity type that is electrically connected to the first load terminal 11.

The above illustrated first embodiment and second embodiment of the inactive mesa 19 (or, respectively, the inactive portion of the active mesa 18) may allow for providing the configuration of the power unit cell 1-1 to prevent the load current from crossing said transition 191 between the inactive mesa 19 and the first load terminal 11.

The inactive mesa 19 may be laterally confined by the control trench 14 and a further trench, e.g., the dummy trench 15, or by the dummy trench 15 and another trench type, which will be elucidated further below. Further optional aspects of the inactive mesa 19 will be described below. For example, even though the dummy trench electrode 151 may be electrically connected to the control terminal 13 in an example, the dummy trench electrode 151 is not configured to control the load current in the inactive mesa 19, since the inactive mesa 19 (or, respectively, the inactive portion of the active mesa 18) does not allow for inducing an inversion channel within the inactive mesa 19, in accordance with an embodiment. Hence, in an embodiment, the configuration of the dummy trench electrode 151 (i.e., the further trench electrode) to not control the load current can be achieved by positioning the dummy trench 15 (i.e., the further trench) between and adjacent to two inactive mesas 19, or, respectively, between and adjacent to inactive portions of two active mesas 18 or, respectively, between and adjacent to an inactive mesa 19 on one side and adjacent to an inactive mesa portion of an active mesa 18 on the other side.

The at least one power unit cell 1-1 of the IGBT 1 can have a semiconductor barrier region 105 (in the following referred to as barrier region) implemented in the semiconductor body 10 and comprising dopants of the second conductivity type.

In an embodiment, the barrier region 105 can laterally overlap with both the active mesa 18 and a bottom 155 of the dummy trench 15, e.g., as illustrated in FIG. 2. As also clearly illustrated in FIG. 8 and FIG. 9, the barrier region 105 may overlap with at least 50% of the width (e.g., along the first lateral direction X) of the active mesa 18. In an embodiment, the barrier region may overlap with more than 50% of the width (e.g., along the first lateral direction X) of the active mesa 18, e.g., with the entire width of the active mesa 18 and, optionally, also with entire width of the dummy trench 15. At this point, it is emphasized that the barrier region 105 may be electrically floating and that said lateral overlap may also be formed in case the at least one power unit cell does not comprise the inactive mesa 19. Further, as illustrated, the barrier region 105 may also laterally overlap with the control trench 14, e.g., with the bottom 145 of the control trench 14. e.g., with the entire bottom 145 of the control trench 14.

Irrespective of said lateral overlap, in an embodiment, the barrier region 105 is electrically floating. For example, the barrier region 105 is not electrically connected with a defined electrical potential, e.g., neither to the first load terminal 11, nor to the second load terminal 12, nor to the control terminal 13. In an embodiment, the electrically floating barrier region 105 can be connected, by means of a connection having a high ohmic resistance, to a defined electrical potential (e.g., to an electrical potential of a contact or to an electrical potential of another semiconductor region). For example, by means of said high ohmic connection, during a switching operation of the IGBT 1, the electrical potential of the barrier region 105 is temporarily decoupled from the defined electrical potential. Said decoupling may occur on a time scale of said switching operation, e.g., for at least 10 ns, or at least 100 ns, or at least 10 µs. For example, the resistance of said high ohmic connection amounts to more than 1e2Ω, or to more than 1e6Ω. In an embodiment, an ohmic resistance, e.g. measured during a standstill situation, between the first load terminal 11 and the barrier region 105 amounts to more than 1e2Ω, or to more than 1e6Ω. For example, for ensuring that the barrier region 105 is electrically floating, in an embodiment, the barrier region 105 does not extend into the inactive termination structure 1-3; e.g., the barrier region 105 can exclusively be arranged within the active region 1-2.

In an embodiment, the barrier region 105 is configured to provide for an electrically conductive path between a section of the active mesa 18 and the bottom 155 of the dummy trench 15. Thus, the barrier region 105 may be configured to guide the electrical potential of the section of the active mesa 18 to the bottom 155 of the dummy trench 15.

The barrier region 105 may exhibit a resistivity of more than 10 Ωcm and of less than 1000 Ωcm, e.g., of more than 100 Ωcm and of less than 500 Ωcm, in accordance with an embodiment.

The barrier region 105 may include at least one of boron (B), aluminum (Al), difluoroboryl (BF$_2$), boron trifluoride (BF$_3$), or a combination thereof. A respective one of these exemplary materials may serve as the dopant material, in accordance with an embodiment. Further, a respective one of these exemplary materials can be implanted into the semiconductor body 10 so as to form the barrier region 105.

For example, the barrier region 105 exhibits a dopant concentration greater than 1e14 cm$^{-3}$ and smaller than 1e18 cm$^{-3}$. Said dopant concentration, e.g., amounting to approximately 1e16 cm$^{-3}$, may be present with an extension along the extension direction Z of at least 0.5 µm, or of at least 1 µm.

Further, the barrier region 105 may exhibit a maximum dopant concentration in a region where the bottom 155 of the dummy trench 15 extends into the barrier region 105.

Figure 4:
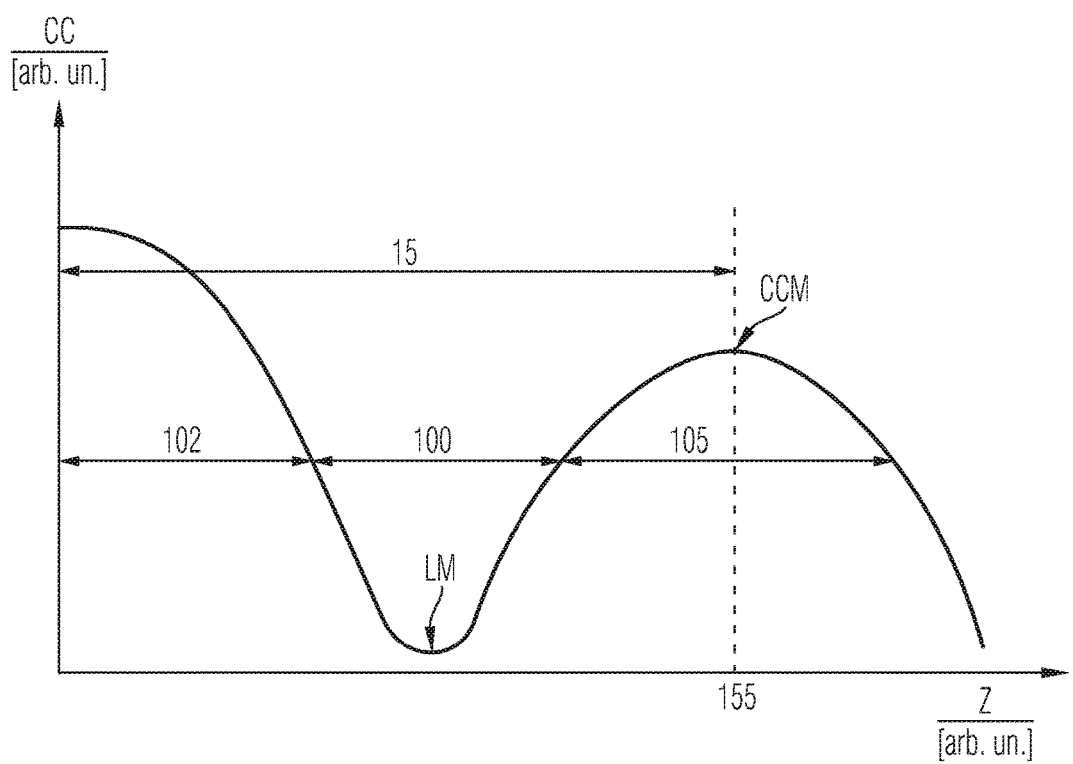
FIG. 4 schematically and exemplarily illustrates a course of a dopant concentration in an IGBT in accordance with one or more embodiments.

An exemplary course of the dopant concentration of dopants of the second conductivity type along the extension direction Z is illustrated in FIG. 4. Such course may be present in both the active mesa 18 and the inactive mesa 19. Accordingly, in an upper section of the respective mesa 18/19, e.g., in proximity to the first load terminal 11, the dopant concentration CC may be comparatively high so as to provide for the channel region 102 (that is, e.g., not electrically connected to the first load terminal in case of the inactive mesa 19). The dopant concentration CC then decreases rapidly in a section of the mesa where the drift region 100 is present. As it is known to the skilled person, the transition between the channel region 102 and the drift region 100 may form a first pn-junction 1021 within the respective mesa. In case the inactive mesa 19 does not comprise a section of the channel region 102, the value of the dopant concentration CC between the beginning at the first load terminal 11 and the beginning of the barrier region 105 would accordingly be at the value corresponding to the local minimum LM illustrated in FIG. 2. Then, e.g., before the respective trench bottom 145/155, the dopant concentration CC increases (again) so as to form the barrier region 105. As illustrated, the barrier region 105 may exhibit its dopant concentration maximum CCM at the depth level being substantially identical to the level where the respective trench terminates, e.g., at the level of the bottom 155 of the dummy trench 15.

Regarding exemplary spatial dimensions of the barrier region 105, the barrier region 105 may extend into the active mesa 18 and from there below the bottom 145 of the control trench 14 and across the inactive mesa 19 so as to interface with the bottom 155 of the dummy trench 15. In an embodiment, both the bottom 155 of the dummy trench 15 and the bottom 145 of the control trench 14 may extend into the barrier region 105.

The barrier region 105 may be separated from the channel region 102 by means of at least a part of the drift region 100. For example, the barrier region 105 may form a "carpet" arranged in parallel to both the first load terminal 11 and the second load terminal 12 and separated from each of these terminals 11, 12 by means of at least the drift region 100. Such carpet like configuration of the barrier region 105 may be positioned within the semiconductor body 10 such that the trench bottoms 145 and 155 may plunge into the barrier region 105.

For example, the barrier region 105 exhibits a thickness along the extension direction Z within the range of 0.1 µm to 0.5 µm, within the range of 0.5 µm to 1 µm, or within the range of 1 µm to 5 µm.

Subsequent to the barrier region 105, the drift region 100 may extend along the extension direction Z until it interfaces with a doped contact region 108 that is arranged in electrical contact with the second load terminal 12. The section of the drift region 100 arranged between the barrier region 105 and the doped contact region 108 may form the major part of the drift region 100.

The doped contact region 108 may be formed in accordance with the configuration of the IGBT 1; e.g., the doped contact region 108 can comprise an emitter region with dopants of the second conductivity type. For forming an RC-IGBT, the doped contact region 108 may comprise an emitter region with dopants of the second conductivity type and intersected by small sections with dopants of the first conductivity type that are also electrically connected to the second load terminal 12 and which are commonly referred to as "n-shorts".

In an embodiment of the IGBT 1, the doped contact region 108 comprises a p-type emitter, and the active mesa 18 may entirely laterally overlap with the p-type emitter 108.

Further, the doped contact region 108 may comprise a field stop region of the first conductivity type, e.g., between the p-type emitter region and the drift region 100. In the context of IGBTs, the concept of a field stop region is generally known to the skilled person and, hence, it is refrained from further elucidating this optional aspect.

Returning to the barrier region 105, the barrier region 105 may form each of an upper pn-junction 1051 and a lower pn-junction 1052 with the drift region 100. For example, the lower pn-junction 1052 is arranged lower than both the bottom 155 of the dummy trench 15 and the bottom 145 of the control trench 14. For example, the upper pn-junction 1051 is arranged within both the active mesa 18 and the inactive mesa 19.

The distance between the first pn-junction 1021 and the upper pn-injunction 1051 along the extension direction Z may amount to at least 0.5 µm. Thus, the two pn-junctions 1021 and 1051 are not identical to each other, but separated from each other by means of the drift region 100, in accordance with an embodiment. In other words, the barrier region 105 may be separated from the channel region 102 by means of at least a part of the drift region 100.

For example, the upper pn-junction 1051 may even be arranged lower than both the bottom 155 of the dummy trench 15 and the bottom 145 of the control trench 14 (wherein this example is not illustrated). In that case, a distance along the extension direction Z between the bottom 155 of the dummy trench 15 and the upper pn-junction 1051 can be smaller than 3 µm, smaller than 2 µm, or even smaller than 1 µm.

The barrier region 105 may be implemented as a contiguous barrier layer within the active cell field 1-2 of the IGBT 1, e.g., as said "carpet". As has been indicated above, both the bottom 155 of the dummy trench 15 and the bottom 145 of the control trench 14 may extend into the barrier region 105, e.g., both the dummy trench 15 and the control trench 14 may extend into the barrier region 105 by at least 100 nm, by at least 500 nm or by at least 1000 nm.

As has been stated above, the IGBT 1 may comprise a plurality of power unit cells 1-1, e.g., all of them included in the active region 1-2. For example, the barrier region 105 connects the inactive mesas 19 included in the plurality of power unit cells 1-1 with each other. For example, to this end, the barrier region 105 may extend partially into each of the inactive mesas 19, e.g., in a manner as schematically illustrated with respect to one power unit cell 1-1 in FIG. 2.

Figure 3:
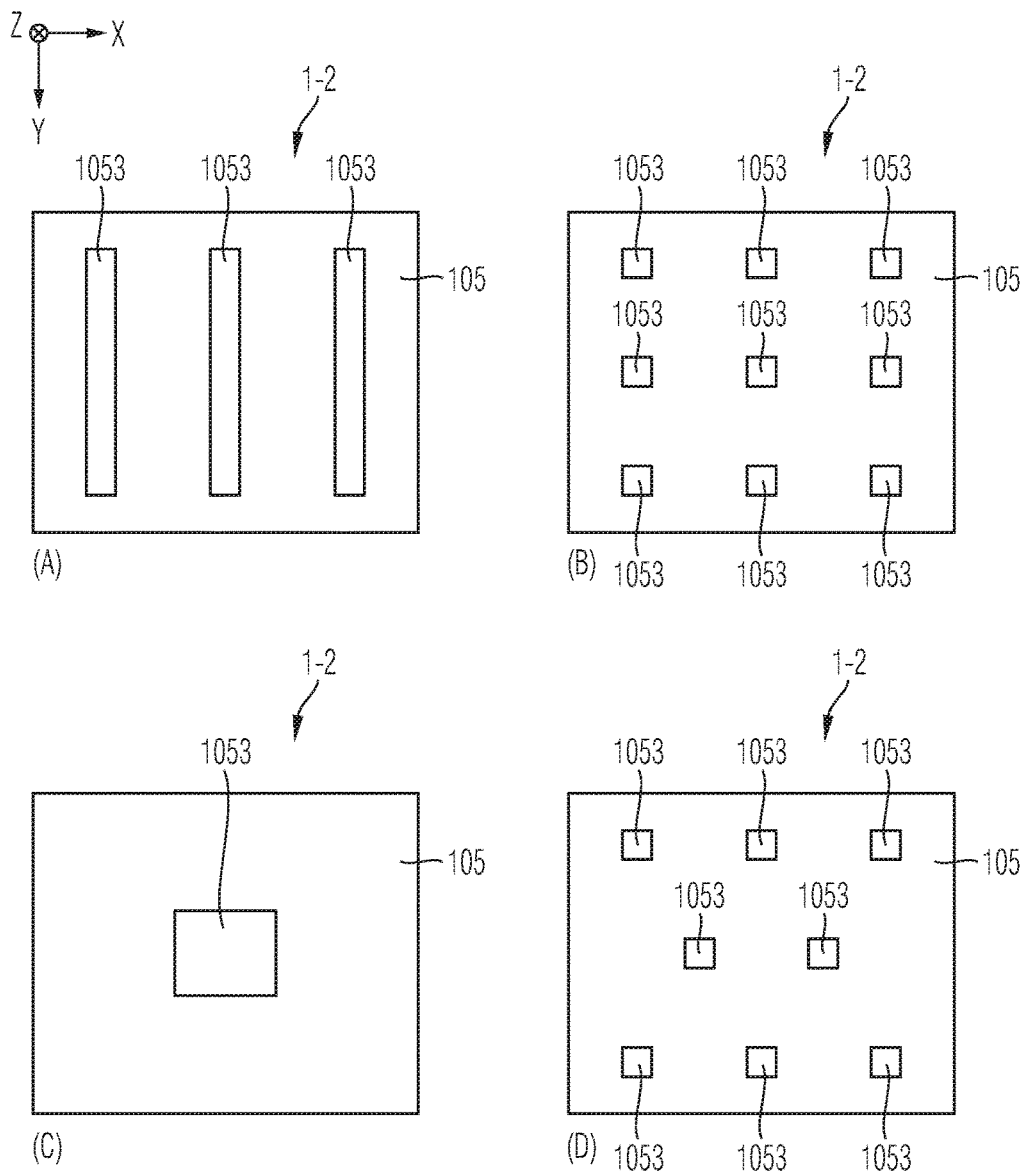
FIG. 3 schematically and exemplarily illustrates sections of a horizontal projections of an IGBT in accordance with some embodiments.

Referring further to the illustrations in FIG. 3, the barrier region 105 may comprise one or more recesses 1053, wherein the drift region 100 extends entirely into each of the one or more recesses 1053, and wherein the one or more recesses 1053 laterally overlap with the active mesa 18.

Adhering to the visual vocabulary introduced above, the barrier region 105 may be implemented as a "patchwork carpet", wherein the one or more recesses 1053 are entirely filled with sections of the drift region 100. The dimensions, the positions and the numbers of recesses 1053 can be chosen in accordance with the cell configuration. For example, if the one or more power unit cells 1-1 are implemented as a stripe cells, stripe like recesses 1053 may be appropriate (cf. variant A). Alternatively, a plurality of small cellular formed recesses 1053 (cf. variants B and D) or a singular larger recess 1053 (cf. variant C) may be provided.

For example, the one or more recesses 1053 provide for a load current passage. Thus, in accordance with an embodiment, the load current conducted by the semiconductor body 10 does not have to traverse the barrier region 105, but may path through the one or more recesses 1053.

For example, the barrier region 105 is absent, i.e., exhibits said at least one recess 1053, in a vertical projection (along the extension direction Z) of the inversion channels that may be induced in the active mesas 18. In this respect, it is recalled that, within each of one or more of the power unit cells 1-1. The source region 101 may be laterally structured along the second lateral direction Y. This lateral structure of the source region 101 may be reflected by corresponding positions of the recesses 1053 in the barrier region 150.

Figure 11:
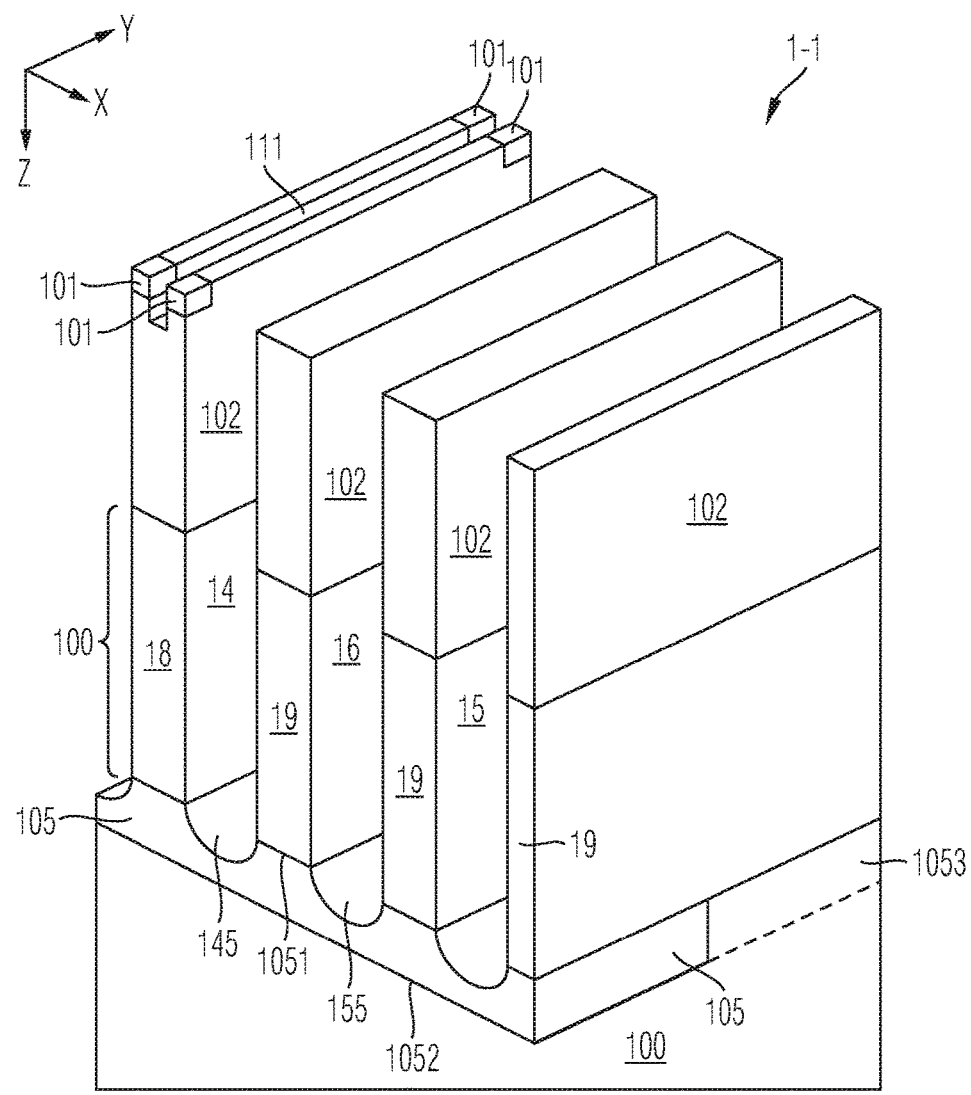
FIG. 11 schematically and exemplarily illustrates a section of a perspective projection of an IGBT in accordance with one or more embodiments.

At this occasion, it shall be understood that the herein described lateral overlap that may be present between the barrier region 105 and other portions of the power unit cell(s) 1-1, e.g., at least one of the active mesa 18 and the further trench 15, refers to a section of a vertical cross-section of the IGBT 1, e.g., in parallel to the plane defined by the first lateral direction X and the extension (vertical) direction Z. e.g., to a section where the barrier region 105 does not exhibit one or more of said recess(es) 1053. This is, e.g., more clearly shown in the schematic and exemplary illustration of FIG. 11; there, the barrier region 105 has a stripe-like recess 1053 that extends longitudinally along the first lateral direction X. Of course, in the region where such recess 1053 is present, there cannot be a lateral overlap between the barrier region 105 and other portions of the power unit cell(s) 1-1. Further, as also illustrated in FIG. 11, the introductorily mentioned and optional lateral structure of the source region 101 is exemplarily implemented; accordingly, in an embodiment, the source region 101 may be structured along the second lateral direction Y within the respective power unit cell 1-1. For example, the source region is only locally provided, with intermission regions (e.g., formed by the channel region 102 of the second conductivity type) separating adjacent local source regions 101 along the second lateral direction Y. Further, at least some of the local source regions 101 may laterally overlap with the at least one recess 1053, as exemplarily illustrated in FIG. 11.

Referring to the embodiment schematically illustrated in FIG. 6, the at least one power unit cell 1-1 of the IGBT 1 may further comprise at least one source trench 16 that extends into the semiconductor body 10 along the extension direction Z and includes an insulator 162 that insulates a source trench electrode 161 from the semiconductor body 10, the source trench electrode 161 being electrically connected to the first load terminal 11.

For example, the at least one source trench 16 is arranged between the control trench 14 and the dummy trench 15, as illustrated in FIG. 6. In an embodiment, the at least one power unit cell 1-1 may comprise more than one source trench 16, e.g., two source trenches 16, wherein each of the trench electrodes 161 of the source trenches may be electrically connected to the first load terminal 11. For example, the more than one source trenches 16 are arranged between the control trench 14 on the one side and the dummy trench 15 on the other side.

In an embodiment, the active mesa 18 may be laterally confined by the control trench 14 and the source trench 16. For example, the sidewall 144 of the control trench 14 and a sidewall 164 of the source trench 16 confine the active mesa 18 along the first lateral direction X. The active mesa 18 may be configured in a manner that has exemplarily been described with respect to FIG. 2; e.g., the contact plug 111 may electrically connect both the section of the channel region 102 and the section(s) of the source region 101 to the first load terminal 11.

Further, in accordance with the embodiment illustrated in FIG. 6, the at least one power unit cell 1-1 may comprise more than one inactive mesa 19, wherein at least one of the inactive mesas 19 can be laterally confined by the source trench 16 and the dummy trench 15. Another inactive mesa 19 can be laterally confined by two source trenches 16. As illustrated, each of the inactive mesas 19 may comprise a respective section of the channel region 102, wherein, in an embodiment, these sections are not electrically connected to the first load terminal 11 but electrically insulated therefrom, e.g., by means of the insulation layer 112.

Referring to the embodiment schematically illustrated in FIG. 5, the at least one power unit cell 1-1 of the IGBT 1 may further comprise, in addition to or as an alternative to the at least one source trench 16, at least one floating trench 17 that extends into the semiconductor body 10 along the extension direction Z and includes an insulator 172 that insulates a trench electrode 171 from the semiconductor body 10, the trench electrode 171 of the floating trench 17 being electrically floating.

Regarding the electrical potential of the electrically floating trench electrode 171, the exemplary description of the embodiment according to which the barrier region 105 is electrically floating may analogously apply to the electrically floating trench electrode 171. Hence, in an embodiment, the trench electrode 171 of the floating trench 17 is neither electrically connected to the first load terminal 11, nor electrically connected to the second load terminal 12, nor electrically connected to the control terminal 13, nor to a section of the semiconductor body 10. For example, in an embodiment, the electrically floating trench electrode 171 can be connected, by means of a connection having a high ohmic resistance, to a defined electrical potential (e.g., to an electrical potential of a contact or to an electrical potential of another semiconductor region). For example, by means of said high ohmic connection, during a switching operation of the IGBT 1, the electrical potential of the electrically floating trench electrode 171 is temporarily decoupled from the defined electrical potential. Said decoupling may occur on a time scale of said switching operation, e.g., for at least 10 ns, or at least 100 ns, or at least 10 μs. For example, the resistance of said high ohmic connection amounts to more than 1e2Ω, or to more than 1e6Ω. In an embodiment, an ohmic resistance, e.g. measured during a standstill situation, between the first load terminal 11 and the electrically floating trench electrode 171 amounts to more than 1e2Ω, or to more than 1e6Ω.

For example, the at least one floating trench 17 can be arranged between the control trench 14 and the dummy trench 15. Further, as illustrated in FIG. 5, the power unit cell 1-1 may additionally comprise at least one source trench 16, wherein the source trench 16 and the floating trench 17 may be arranged between the control trench 14 on the one side and the dummy trench 15 on the other side. In an embodiment, the active mesa 18 is laterally confined by the sidewall 144 of the control trench 14 and the sidewall 164 of the source trench 16. The inactive mesa 19 may be laterally confined by at least two of the group of the sidewall 164 of the source trench 16, the sidewall 174 of the floating trench 17, and the sidewall 154 of dummy trench 15.

Thus, in accordance with the embodiment of FIG. 6, the least one power unit cell 1-1 comprises both the at least one source trench 16 and the at least one floating trench 17, wherein the at least one source trench 16 and the at least one floating trench 17 are arranged between the control trench 14 and the dummy trench 15.

In an embodiment, the IGBT 1 and each of its power unit cells 1-1 may exhibit a micro pattern trench (MPT) structure.

For example, each of the trenches 14, 15, 16, 17 that may be included in the power unit cell 1-1 may, e.g., exhibit equal spatial dimensions, and may be arranged in accordance with a regular pattern. For example, each of the trenches 14, 15, 16, 17 may exhibit a depth along the extension direction Z within the range of 3 μm to 8 μm, and a width along the first lateral direction X within the range of 0.4 μm to 1.6 μm.

Further, each of the trench electrodes 141, 151, 161, 171 of all trenches 14, 15, 16, 17 that may be included in the at least one power unit cell 1-1 may exhibit equal spatial dimensions. In addition, each of the trenches 14, 15, 16, 17 that may be included in the at least one power unit cell 1-1 can be arranged equidistantly along the first lateral direction X. Hence, both mesas 18 and 19 of each power unit cell 1-1 may exhibit the same width, which may be within the range of 0.1 μm to 0.3 μm, within the range of 0.3 μm to 0.8 μm, or within the range of 0.8 μm to 1.4 μm.

In another embodiment, each of the trenches 14, 15, 16, 17 that may be included in the at least one power unit cell 1-1 are not arranged equidistantly along the first lateral direction X. For example, in such embodiment, the inactive mesa 19 may exhibit a greater width than the active mesa 18, e.g., the width of the inactive mesa 19 may amount to at least 150% of the width of the active mesa 18.

Further, each of the trenches 14, 15, 16, 17 that may be included in the power unit cell 1-1 may extend into the barrier region 105, e.g., by at least 100 nm, by at least 500 nm or by at least 1000 nm.

For the following explanations, the following abbreviations may apply:
G=control trench 14
D=dummy trench 15
S=source trench 16
F=floating trench 17
k=active mesa 18
o=inactive mesa 19

As has been stated above, the IGBT 1 may comprise a plurality of equally configured power unit cells 1-1. In an embodiment, using the applications introduced above, exemplary neighborhood relationship within in each power unit cell 1-1 may be expressed as follows:
exemplary neighborhood relationship #1: kGkSoSoDoDoSoS
exemplary neighborhood relationship #2: kGkSoFoDoDoDoDoFoS
exemplary neighborhood relationship #3: kGkSoSoDoDoSoS With respect to all embodiments discussed above, it shall be understood that, in accordance with a variant, the sections of the drift region 100 that are included in the mesas 18 and 19, e.g., the sections forming the pn-junction 1021 with the channel region 102 and the upper pn-junction 1051 with the barrier region 1051, may exhibit a dopant concentration at least twice as great as compared to the dopant concentration of the section of the drift region 100 arranged below the barrier region 105. e.g., the section of the drift region 100 that forms the lower pn-junction 1052 with the barrier region 105. Said sections of the drift region 100 that are included in the mesas 18 and 19 may each exhibit a maximum dopant concentration within the range of 1e14 cm$^{-3}$ to 1e18 cm$^{-3}$, e.g., a maximum dopant concentration of at least 1e16 cm$^{-3}$. For example, said sections of the drift region 100 that are included in the mesas 18 and 19 and that may exhibit said increased dopant concentrations can be referred to as "n-barrier regions". For example, the dopant concentration of the sections of the drift region 100 that are included in the mesas 18 and 19 is chosen such that the upper pn-junction 1051 remains at a level slightly above the trench bottoms 145 and 155.

Figure 7:
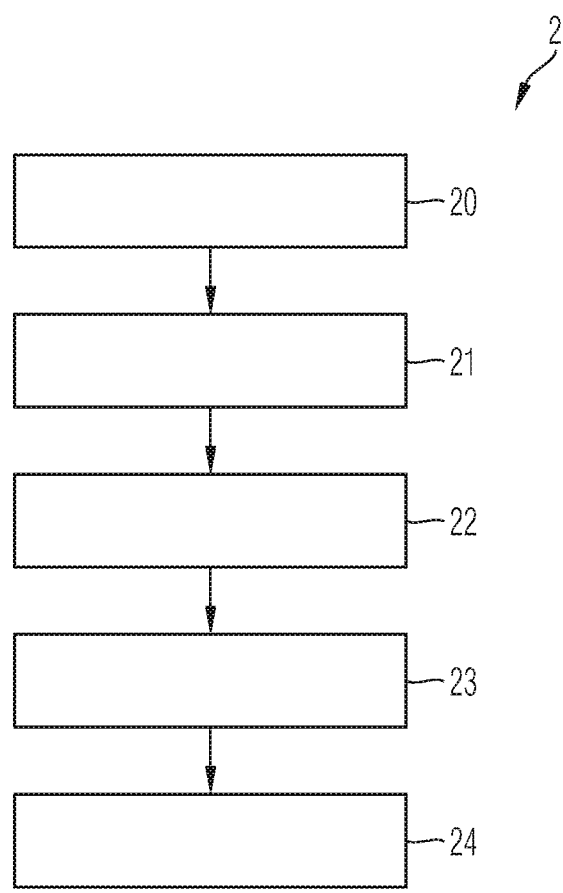
FIG. 7 schematically and exemplarily illustrates steps of a method of processing an IGBT in accordance with one or more embodiments.

Regarding finally the illustration of FIG. 7, a method 2 of processing an IGBT is herewith presented. For example, the embodiment of the method 2 illustrated in FIG. 7 may be employed so as to manufacture one or more exemplary embodiments of the IGBT 1 described above, e.g., with respect to the preceding FIGS. 1 to 6.

In step 20, a semiconductor body 10 may be provided that is configured to be coupled to a first load terminal 11 and a second load terminal 12 of the IGBT 1 and that comprises a drift region 100 configured to conduct a load current between said terminals 11, 12, wherein the drift region 100 comprises dopants of a first conductivity type.

In step 23, at least one power unit cell 1-1 may be formed, wherein the at least one power unit cell 1-1 may include: at least one control trench 14 having a control trench electrode 141 and at least one further trench 15 having a further trench electrode 151 coupled to the control electrode 141; at least one active mesa 18 comprising a source region 101 with dopants of the first conductivity type and electrically connected to the first load terminal 11 and a channel region 102 with dopants of a second conductivity type and separating the source region 101 and the drift region 100, wherein, in the active mesa 18, at least a respective section of each of the source region 101, the channel region 102 and the drift region 100 are arranged adjacent to a sidewall 144 of the control trench 14, and wherein the control trench electrode 141 is configured to receive a control signal from a control terminal 13 of the IGBT 1 and to control the load current in the active mesa 18; and, optionally, at least one inactive mesa 19 arranged adjacent to the at least the dummy trench 15, wherein a transition 191 between the first load terminal 11 and the inactive mesa 19 provides an electrical insulation 112 at least for charge carriers of the first conductivity type.

For example, in step 21, said source region 101 may be provided that is electrically connected with the first load terminal 11 and that comprises dopants of the first conductivity type. Preceding or subsequent to step 21, said channel region 102 may be provided in step 22 that comprises dopants of the second conductivity type and separates the source region 101 and the drift region 100

Regarding exemplary ways of configuring the active mesa 18 and the (optional) inactive mesa 19, it is referred to the exemplary description of embodiments of the IGBT 1 given above: this description may analogously apply to embodiments of the method 2.

In step 24, a semiconductor barrier region 105 may be formed in the semiconductor body 10, wherein the barrier region 105 (which may be electrically floating) comprises dopants of the second conductivity type and may laterally overlap with both the active mesa 18 and a bottom 155 of the further trench 15. Regarding exemplary ways of configuring the barrier region 105, it is referred to the exemplary description of the embodiments of the IGBT 1 given above; this description may analogously apply to embodiments of the method 2.

For example, forming (cf. step 24) the electrically floating barrier region 105 includes carrying out an implantation processing step. The implantation processing step can be carried out with an implantation energy within the range of 10 keV to 100 keV, and/or with an implantation dose within the range of 1 MeV to 3 MeV.

Figure 8:
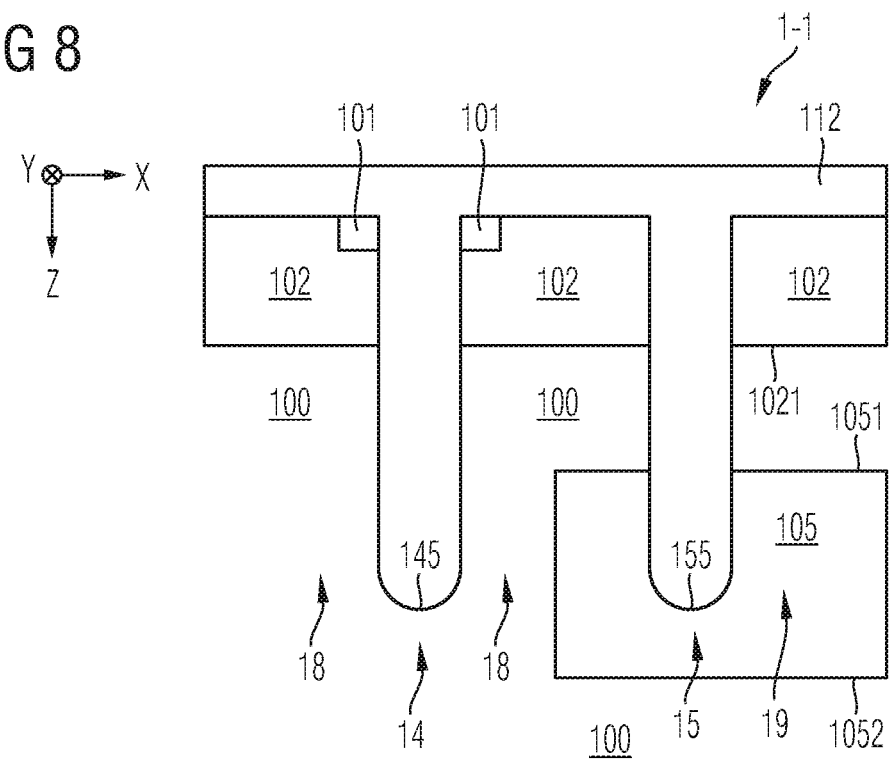
FIG. 8 schematically and exemplarily illustrates a section of a vertical cross-section of an IGBT in accordance with one or more embodiments.
Figure 9:
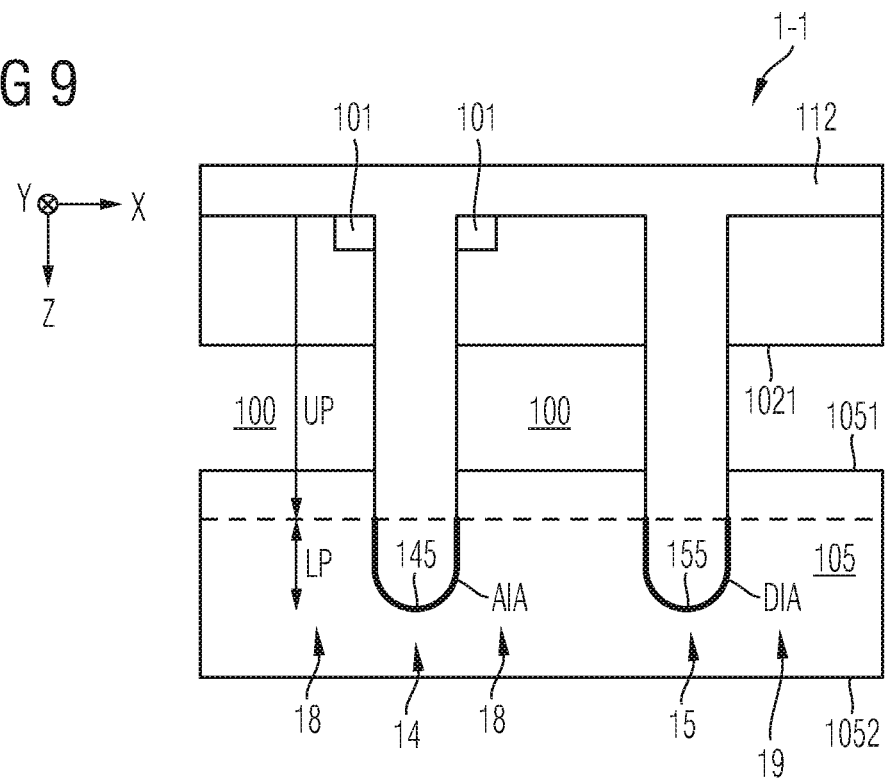
FIG. 9 schematically and exemplarily illustrates a section of a vertical cross-section of an IGBT in accordance with one or more embodiments.
Figure 10:
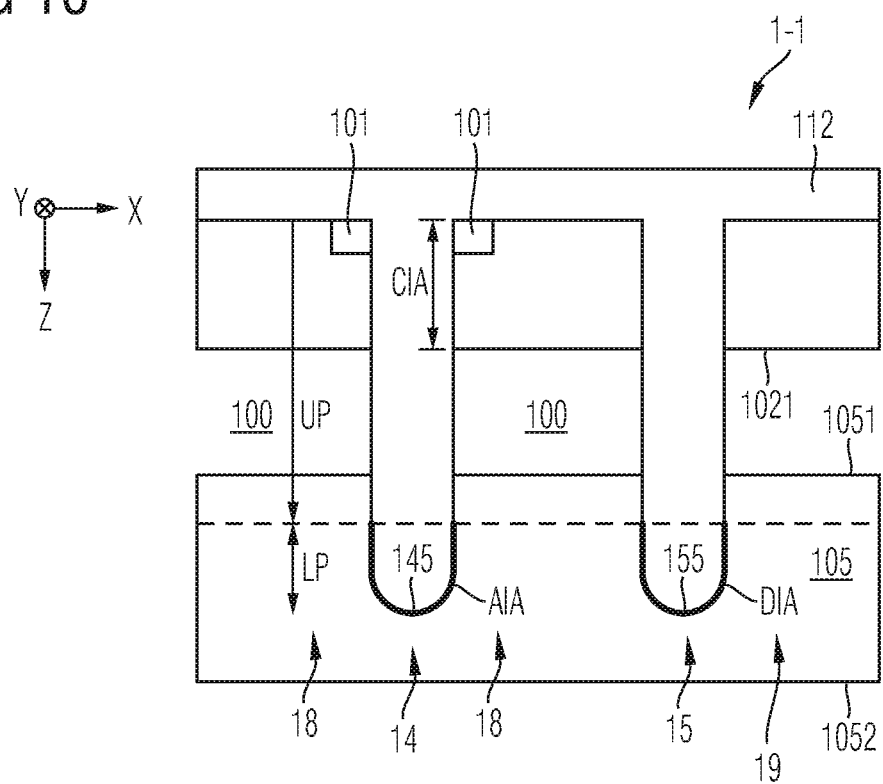
FIG. 10 schematically and exemplarily illustrates a section of a vertical cross-section of an IGBT in accordance with one or more embodiments.

Finally referring to FIGS. 8 to 10, further embodiments shall be briefly described:

E.g., as illustrated in FIGS. 8 to 10, according to an embodiment, an IGBT 1 comprises: a semiconductor body (cf. reference numeral 10 in the other drawings) coupled to a first load terminal 11 and a second load terminal 12 of IGBT 1 and comprising a drift region 100 configured to conduct a load current between said terminals 11, 12, the drift region 100 comprising dopants of the first conductivity type; and at least one power unit 1-1 cell that includes at least one control trench 14 having a control trench electrode 141 and at least one further trench 15 having a further trench electrode 151, e.g., coupled to the control trench electrode 141. Further the at least one power unit cell has at least one active mesa 18 comprising a source region 101 with dopants of the first conductivity type and electrically connected to the first load terminal 11 and a channel region 102 with dopants of the second conductivity type and separating the source region 101 and the drift region 100, wherein, in the active mesa 18 at least a respective section of each of the source region 101, the channel region 102 and the drift region 100 are arranged adjacent to a sidewall (cf. reference numeral 144 in the other drawings) of the control trench 14, and wherein the control trench electrode 141 is configured to receive a control signal from a control terminal (cf. reference numeral 13 in the other drawings) of the IGBT and to control the load current in the active mesa 18.

As illustrated in FIG. 8, in an embodiment, an electrically floating semiconductor barrier region 105 can be implemented in the semiconductor body 10. The barrier region 105 comprises dopants of the second conductivity type and laterally overlaps with both the active mesa 18 and a bottom of the further trench 15. As has been described in greater detail above, the barrier region 105 may even extend further in parallel to the first lateral direction X, e.g., so as to extend along the entire width of the active mesa 18.

Now referring to FIGS. 9 and 10, according to an embodiment, an IGBT 1 comprises: a semiconductor body (cf. reference numeral 10 in the other drawings) coupled to a first load terminal 11 and a second load terminal 12 of IGBT 1 and comprising a drift region 100 configured to conduct a load current between said terminals 11, 12, the drift region 100 comprising dopants of the first conductivity type; and at least one power unit 1-1 cell that includes at least one control trench 14 having a control trench electrode 141 and at least one further trench 15 having a further trench electrode 151, e.g., coupled to the control trench electrode 141. Further the at least one power unit cell has at least one active mesa 18 comprising a source region 101 with dopants of the first conductivity type and electrically connected to the first load terminal 11 and a channel region 102 with dopants of the second conductivity type and separating the source region 101 and the drift region 100, wherein, in the active mesa 18 at least a respective section of each of the source region 101, the channel region 102 and the drift region 100 are arranged adjacent to a sidewall (cf. reference numeral 144 in the other drawings) of the control trench 14, and wherein the control trench electrode 141 is configured to receive a control signal from a control terminal (cf. reference numeral 13 in the other drawings) of the IGBT and to control the load current in the active mesa 18. At least one inactive mesa 19 arranged adjacent to the at least one further trench 15 may be provided in the power unit cell 1-1, wherein a transition (cf. reference numeral 191 in the other drawings) between the first load terminal 11 and the inactive mesa 19 provides an electrical insulation 112 at least for charge carriers of the first conductivity type. A semiconductor barrier region 105 implemented in the semiconductor body 10 and comprising dopants of the second conductivity type may be provided. The barrier region 105 may be electrically floating.

A respective lower portion LP of both the control trench 14 and the further trench 15 may extend into the barrier region 105, each lower portion LP being formed by the deepest fifth part of the respective trench 14, 15. Analogously, a respective lower portion LP of both the control trench electrode 141 and the further trench electrode 151 may extend into the barrier region 105, each lower portion LP being formed by the deepest fifth part of the respective trench electrode 141, 151 (wherein, of course, the trench electrodes 141, 152 remain isolated from the semiconductor body).

A respective upper portion UP of both the control trench 14 and the further trench 15 are formed by the remaining four fifth parts of the respective trench 14, 15, wherein the upper portion UP of the control trench 14 can be arranged adjacent to the source region 101 and the channel region 102. Analogously, respective upper portion UP of both the control trench electrode 141 and the further trench electrode 151 can be formed by the remaining four fifth parts of the respective trench electrodes 141, 151, wherein the upper portion UP of the control trench electrode 141 can overlap with the source region 101 and the channel region 102 along the extension direction Z.

In an embodiment, also the respective upper portion UP of both the control trench 14 and the further trench 15 may extend partially into the barrier region 105.

A total active intersection area AIA (cf. bold course of the control trench) is defined by a transition between the lower portion LP of the control trench 14 and the barrier region 105.

A total further intersection area DIA (cf. bold course of the further trench 15) is defined by a transition between the lower portion LP of the further trench 15 and the barrier region 105.

A total channel intersection area CIA (cf. FIG. 10) is defined by a transition between the upper portion UP of the control trench 15 and a subregion formed by both the source region 101 and the channel region 102 in the active mesa 18. In said subregion, the inversion channel may be induced for conducting the load current, as has been explained earlier.

Said intersection areas AIA, DIA and CIA may be formed, in each respective power unit cell 1-1, along the total extension of the respective power unit cell 1-1 in the second lateral direction Y.

In accordance with an embodiment, the active intersection area AIA amounts to at least one tenth of the further intersection area DIA and to no more than the further intersection area DIA. For example, the barrier region 105 may be laterally structured (in terms of said one or more recesses 1053) within the active region 1-2 such that each further trench 15 of the power unit cells 1-1 extends into the barrier region 105 and such that the plurality of the control trenches 14 of the power unit cells 1-1 only extend partially or not as far into the barrier region 105 as the further trenches 15. In addition to the exemplary provision that the active intersection area AIA amounts to at least one tenth of the further intersection area DIA and to no more than the further intersection area DIA, the barrier region 105 may further laterally overlap with the active mesas 18, as has been explained above; e.g., by continuously (with or without said recess 1053) extending within the active region 1-2.

In accordance with a further embodiment, for each of the power unit cells, the total channel intersection area CIA can be smaller than the sum of the active intersection area AIA and the further intersection area DIA. The fulfillment of this provision may yield an improved capacitance ratio characteristic of the IGBT 1. E.g., irrespective of the lateral structure of the barrier region 105 (in terms of its optional one or more recesses 1053), it can be ensured for the entire IGBT 1 including its power unit cells 1-1, that the total channel intersection area CIA can be smaller than the sum of the active intersection area AIA and the further intersection area DIA by providing that the control trenches 14 and the further trenches 15 extend partially into the barrier region 105 where there is no recess.

Regarding the embodiments described with respect to FIGS. 8 to 10, it shall be understood that, herein, also corresponding processing methods are presented that are summarized below. Embodiments of these methods may correspond to the embodiments of the IGBT described herein.

According to another embodiment, a method of processing an IGBT comprises: providing a semiconductor body configured to be coupled to a first load terminal and a second load terminal of the IGBT and comprising a drift region configured to conduct a load current between said terminals, the drift region comprising dopants of a first conductivity type; and forming at least one power unit cell that includes at least one control trench having a control trench electrode and at least one further trench having a further trench electrode coupled to the control trench electrode; at least one active mesa comprising a source region with dopants of the first conductivity type and electrically connected to the first load terminal and a channel region with dopants of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the IGBT and to control the load current in the active mesa, the further trench electrode not being configured to control the load current; and, in the semiconductor body, forming an electrically floating semiconductor barrier region comprising dopants of the second conductivity type, the barrier region laterally overlapping with both the active mesa and a bottom of the further trench.

According to another embodiment, a method of processing an IGBT comprises: providing a semiconductor body configured to be coupled to a first load terminal and a second load terminal of the IGBT and comprising a drift region configured to conduct a load current between said terminals, the drift region comprising dopants of a first conductivity type; and forming at least one power unit cell that includes at least one control trench having a control trench electrode and at least one further trench having a further trench electrode; at least one active mesa comprising a source region with dopants of the first conductivity type and electrically connected to the first load terminal and a channel region with dopants of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the IGBT and to control the load current in the active mesa; and, in the semiconductor body, forming an electrically floating semiconductor barrier region comprising dopants of the second conductivity type, the barrier region laterally overlapping with both an entire width of the active mesa and a bottom of the further trench.

According to an embodiment, a method of processing an IGBT comprises: providing a semiconductor body coupled to a first load terminal and a second load terminal of IGBT and comprising a drift region configured to conduct a load current between said terminals, the drift region comprising dopants of a first conductivity type; and forming at least one power unit cell that includes at least one control trench having a control trench electrode and at least one further trench having a further trench electrode. Further the at least one power unit cell has at least one active mesa comprising a source region with dopants of the first conductivity type and electrically connected to the first load terminal and a channel region with dopants of a second conductivity type and separating the source region and the drift region, wherein, in the active mesa at least a respective section of each of the source region, the channel region and the drift region are arranged adjacent to a sidewall of the control trench, and wherein the control trench electrode is configured to receive a control signal from a control terminal of the IGBT and to control the load current in the active mesa; and at least one inactive mesa arranged adjacent to the at least one further trench, wherein a transition between the first load terminal and the inactive mesa provides an electrical insulation at least for charge carriers of the first conductivity type; and forming, in the semiconductor body, a semiconductor barrier region that comprises dopants of the second conductivity type, such that: A respective lower portion of both the control trench and the further trench extends into the barrier region, each lower portion being formed by the deepest fifth part of the respective trench; a total active intersection area is defined by a transition between the lower portion of the control trench and the barrier region, and a total further intersection area is defined by a transition between the lower portion of the further trench and the barrier region; and such that active intersection area amounts to at least one tenth of the further intersection area and to no more than the further intersection area.

According to an embodiment, a method of processing an IGBT comprises: providing a semiconductor body coupled to a first load terminal and a second load terminal of IGBT and comprising a drift region configured to conduct a load current between said terminals, the drift region comprising dopants of a first conductivity type; and forming at least one power unit cell that includes at least one control trench having a control trench electrode and at least one further trench having a further trench electrode. Further the at least one power unit cell has at least one active mesa comprising a source region with dopants of the first conductivity type and electrically connected to the first load terminal and a channel region with dopants of a second conductivity type and separating the source region and the drift region, wherein, in the active mesa at least a respective section of each of the source region, the channel region and the drift region are arranged adjacent to a sidewall of the control trench, and wherein the control trench electrode is configured to receive a control signal from a control terminal of the IGBT and to control the load current in the active mesa; and at least one inactive mesa arranged adjacent to the at least one further trench, wherein a transition between the first load terminal and the inactive mesa provides an electrical insulation at least for charge carriers of the first conductivity type; and forming, in the semiconductor body, a semiconductor barrier region that comprises dopants of the second conductivity type, such that: A respective lower portion of both the control trench and the further trench extends into the barrier region, each lower portion being formed by the deepest fifth part of the respective trench; such that a respective upper portion of both the control trench and the further trench is formed by the remaining four fifth parts of the respective trench, the upper portion of the control trench being arranged adjacent to the source region and the channel region; such that a total active intersection area is defined by a transition between the lower portion of the control trench and the barrier region; such that a total further intersection area is defined by a transition between the lower portion of the further trench and the barrier region; such that a total channel intersection area is defined by a transition between the upper portion of the control trench and a subregion formed by both the source region and the channel region in the active mesa; and such that the total channel intersection area is smaller than the sum of the active intersection area and the further intersection area.

Optional features and variants of the components of the IGBTs 1 illustrated section-wise in FIGS. 8 to 10 and their corresponding processing methods may correspond to those described above. For example, the further trench 15 mentioned above can be a dummy trench, and the further trench electrode 151 can be a dummy trench electrode. The dummy trench electrode 151 may be electrically coupled to the control trench electrode 141. For example, both the dummy trench electrode 151 and the control trench electrode 141 are electrically coupled to a control terminal 13 of the IGBT 1, wherein, e.g., the control terminal 13 may be electrically connected to an output of a driver unit (not illustrated) for driving the IGBT 1. For example, both the dummy trench electrode 151 and the control trench electrode 141 are electrically connected to the control terminal 13 of the IGBT 1, i.e., by means of a respective low ohmic connection (not illustrated). E.g., the electrical potential of the dummy trench electrode 151 can be at least substantially identical to the electrical potential of the control trench electrode 141. In another embodiment, a first ohmic resistance between the control terminal 13 and the control trench electrode 141 may be different from a second ohmic resistance between the control terminal 13 and the dummy trench electrode 151. The difference between the first ohmic resistance and the second ohmic resistance may be within the range of 0Ω to 100Ω, for example. For example, the second ohmic resistance is greater than the first ohmic resistance.

In accordance with one or more embodiments described herein, an IGBT having a plurality of power unit cells configured in accordance with an MPT structure is presented, wherein each power unit cell has a control trench for controlling the load current in at least one active mesa and, optionally, at least one dummy trench with a trench electrode also electrically connected to the control terminal and arranged adjacent to the at least one inactive mesa, wherein, optionally, the active mesa and the bottom of the dummy trench are connected to each other by means of a p-doped barrier region. Due to such connection, during the switching operation of the IGBT, a voltage swing on the control terminal 13 may be reduced, in accordance with an embodiment. This may allow for an improved control of dV/dt by means of a gate signal, e.g., during switching of the IGBT.

In the above, embodiments pertaining to IGBTs and corresponding processing methods were explained. For example, these IGBTs are based on silicon (Si). Accordingly, a monocrystalline semiconductor region or layer, e.g., the semiconductor body 10 and its regions/zones 100, 101, 102, 105 and 108 can be a monocrystalline Si-region or Si-layer. In other embodiments, polycrystalline or amorphous silicon may be employed.

It should, however, be understood that the semiconductor body 10 and its doped regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor device applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An IGBT, comprising:
    a semiconductor body coupled to a first load terminal and a second load terminal of the IGBT and comprising a drift region configured to conduct a load current between the first and the second load terminals, the drift region comprising dopants of a first conductivity type;
    a power unit cell comprising:
    a control trench having a control trench electrode and a further trench having a further trench electrode electrically coupled to the control trench electrode;
    an active mesa comprising a source region with dopants of the first conductivity type and electrically connected to the first load terminal and a channel region with dopants of a second conductivity type, the channel region separating the source region and the drift region, wherein in the active mesa, at least a respective section of each of the source region, the channel region and the drift region are arranged adjacent to a sidewall of the control trench, and wherein the control trench electrode is configured to receive a control signal from a control terminal of the IGBT and to control the load current in the active mesa, the further trench electrode not being configured to control the load current; and
    an electrically floating semiconductor barrier region in the semiconductor body and comprising dopants of the second conductivity type, the barrier region laterally overlapping with both the active mesa and a bottom of the further trench.

2. The IGBT of claim 1, wherein at least one of:
    the power unit cell further comprises an inactive mesa arranged adjacent to the further trench, a transition between the first load terminal and the inactive mesa providing an electrical insulation at least for charge carriers of the first conductivity type; and
    both the bottom of the further trench and a bottom of the control trench extend into the barrier region.

3. The IGBT of claim 1, wherein the barrier region laterally overlaps with the active mesa for at least 50% of a width of the active mesa.

4. The IGBT of claim 1, wherein the barrier region is electrically floating.

5. The IGBT of claim 1, wherein the further trench is a dummy trench, wherein the further trench electrode is a dummy trench electrode, and wherein both the control trench electrode and the dummy trench electrode are each electrically coupled to the control terminal.

6. The IGBT of claim 1, wherein the barrier region is configured to provide for an electrically conductive path between a section of the active mesa and a bottom of the further trench.

7. The IGBT of claim 1, wherein the barrier region forms each of an upper pn-junction and a lower pn-junction with the drift region, the lower pn-junction being arranged lower than both a bottom of the further trench and a bottom of the control trench.

8. The IGBT of claim 7, wherein the upper pn-junction is arranged within the active mesa.

9. The IGBT of claim 7, wherein the upper pn-junction is arranged within an inactive mesa that is arranged adjacent to the further trench, and wherein a transition between the first load terminal and the inactive mesa provides an electrical insulation at least for charge carriers of the first conductivity type.

10. The IGBT of claim 7, wherein the upper pn-junction is arranged lower than both a bottom of the further trench and a bottom of the control trench, and wherein a distance along an extension direction between the bottom of the further trench and the upper pn-junction is smaller than 3 µm.

11. The IGBT of claim 1, wherein the barrier region is a contiguous barrier layer within an active cell field of the IGBT.

12. The IGBT of claim 1, wherein the barrier region comprises one or more recesses, wherein the drift region extends entirely into each of the one or more recesses, and wherein the one or more recesses laterally overlap with the active mesa.

13. The IGBT of claim 1, wherein the barrier region has a dopant concentration greater than $1e14$ $cm^{-3}$ and smaller than $1e18$ $cm^{-3}$.

14. The IGBT of claim 13, wherein the dopant concentration is present with an extension along an extension direction of at least 0.5 µm.

15. The IGBT of claim 1, wherein the barrier region has a maximum dopant concentration in a region where a bottom of the further trench extends into the barrier region.

16. The IGBT of claim 1, wherein the barrier region has a resistivity of more than 10 Ωcm and of less than 1000 Ωcm.

17. The IGBT of claim 1, wherein the barrier region is separated from the channel region by at least a part of the drift region.

18. The IGBT of claim 1, wherein the power unit cell further comprises at least one of:
    a source trench having a source trench electrode electrically connected to the first load terminal; and
    a floating trench having an electrically floating trench electrode.

19. The IGBT of claim 18, wherein the source trench is arranged between the control trench and the further trench, wherein the active mesa is laterally confined by the control trench and the source trench, wherein an inactive mesa arranged adjacent to the further trench is laterally confined by the source trench and the further trench, and wherein the floating trench is arranged between the control trench and the further trench.

20. The IGBT of claim 1, wherein the active mesa is divided into an active portion and an inactive portion along a width of the active mesa.

21. The IGBT of claim 20, wherein the active portion and the inactive portion have a same share of a total mesa volume of the active mesa.

22. The IGBT of claim 1, wherein the source region is only present between a contact plug to the active mesa and the sidewall of the control trench, wherein the active mesa is active and configured to conduct a part of the load current in a portion of the active mesa where the source region is present, and wherein on a side of the contact plug that faces a trench type other than the control trench, the active mesa has an inactive portion that is configured to conduct no part of the load current.

23. An IGBT, comprising:
    a semiconductor body coupled to a first load terminal and a second load terminal of the IGBT and comprising a drift region configured to conduct a load current between the first and the second load terminals, the drift region comprising dopants of a first conductivity type;
    a power unit cell comprising:
    a control trench having a control trench electrode and a further trench having a further trench electrode;
    an active mesa comprising a source region with dopants of the first conductivity type and electrically connected to the first load terminal and a channel region with dopants of a second conductivity type, the channel region separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the IGBT and to control the load current in the active mesa; and
    an inactive mesa adjacent the further trench, wherein a transition between the first load terminal and the inactive mesa provides an electrical insulation at least for charge carriers of the first conductivity type; and
    a semiconductor barrier region in the semiconductor body and comprising dopants of the second conductivity type,
    wherein:
    a respective lower portion of both the control trench and the further trench extends into the barrier region, each lower portion being formed by a deepest fifth part of the respective trench;
    a respective upper portion of both the control trench and the further trench being formed by the remaining four fifth parts of the respective trench, the upper portion of the control trench being arranged adjacent to the source region and the channel region;
    a total active intersection area is defined by a transition between the lower portion of the control trench and the barrier region;
    a total further intersection area is defined by a transition between the lower portion of the further trench and the barrier region;
    a total channel intersection area is defined by a transition between the upper portion of the control trench and a subregion formed by both the source region and the channel region in the active mesa; and the total channel intersection area is smaller than the sum of the active intersection area and the further intersection area.

24. The IGBT of claim 23, wherein the IGBT comprises a plurality of power unit cells, and wherein the barrier region connects the inactive mesa of each power unit cell with each other.

* * * * *